United States Patent
Orschel et al.

(10) Patent No.: US 8,012,255 B2
(45) Date of Patent: Sep. 6, 2011

(54) METHOD AND APPARATUS FOR CONTROLLING DIAMETER OF A SILICON CRYSTAL INGOT IN A GROWTH PROCESS

(75) Inventors: Benno Orschel, Salem, OR (US); Joel Kearns, Springfield, VA (US); Keiichi Takanashi, Saga (JP); Volker Todt, Lake Oswego, OR (US)

(73) Assignees: Sumco Phoenix Corporation, Phoenix, AZ (US); Sumco Corporation, Tokyo (JP)

( * ) Notice: Subject to any disclaimer, the term of this patent is extended or adjusted under 35 U.S.C. 154(b) by 14 days.

(21) Appl. No.: 12/184,016

(22) Filed: Jul. 31, 2008

(65) Prior Publication Data
US 2010/0024716 A1  Feb. 4, 2010

(51) Int. Cl.
*C30B 15/22* (2006.01)
(52) U.S. Cl. ............... 117/14; 117/11; 117/13; 117/15; 117/931; 117/932
(58) Field of Classification Search ............ 117/11, 117/13, 14, 15, 931, 932
See application file for complete search history.

(56) References Cited

U.S. PATENT DOCUMENTS

| | | | |
|---|---|---|---|
| 4,857,278 A * | 8/1989 | Gevelber et al. ............. | 117/202 |
| 4,943,160 A * | 7/1990 | Gevelber et al. ............. | 356/625 |
| 5,408,952 A | 4/1995 | Wakabayashi et al. | |
| 5,653,799 A | 8/1997 | Fuerhoff | |
| 5,656,078 A | 8/1997 | Fuerhoff | |
| 5,882,402 A | 3/1999 | Fuerhoff | |
| 5,993,902 A | 11/1999 | Heid | |
| 6,171,391 B1 | 1/2001 | Fuerhoff et al. | |
| 6,203,611 B1 * | 3/2001 | Kimbel et al. ................. | 117/15 |
| 6,241,818 B1 * | 6/2001 | Kimbel et al. ................. | 117/13 |
| 6,776,840 B1 | 8/2004 | Fuerhoff et al. | |
| 6,899,758 B2 | 5/2005 | Abe et al. | |
| 2005/0016443 A1 | 1/2005 | Lu et al. | |
| 2006/0130737 A1 * | 6/2006 | Wakabayashi et al. ......... | 117/13 |

FOREIGN PATENT DOCUMENTS

| | | |
|---|---|---|
| JP | 62-083395 | 4/1987 |
| WO | WO/0022201 | 4/2000 |

* cited by examiner

*Primary Examiner* — Matthew Song
(74) *Attorney, Agent, or Firm* — Brinks Hofer Gilson & Lione

(57) ABSTRACT

An improvement to a method and an apparatus for growing a monocrystalline silicon ingot from silicon melt according to the CZ process. The improvement performs defining an error between a target taper of a meniscus and a measured taper, and translating the taper error into a feedback adjustment to a pull-speed of the silicon ingot. The conventional control model for controlling the CZ process relies on linear control (PID) controlling a non-linear system of quadratic relationship defined in the time domain between the diameter and the pull-speed. The present invention transforms the quadratic relationship in the time domain between the diameter and the pull-speed into a simile, linear relationship in the length domain between a meniscus taper of the ingot and the pull-speed. The present invention applies a linear control (modified PID) which operates in the length domain, and controls a system that has a linear relationship between the ingot taper and the pull-speed in the length domain to control the diameter of a growing silicon ingot.

14 Claims, 5 Drawing Sheets

METHOD AND APPARATUS FOR CONTROLLING DIAMETER OF A SILICON CRYSTAL INGOT IN A GROWTH PROCESS

BACKGROUND

This invention relates generally to improvements in controlling the growth process of a monocrystalline silicon ingot and, particularly, to a method and apparatus for accurately controlling the diameter of a monocrystalline silicon ingot during its growth process.

The Czochralski (CZ) process is used to obtain monocrystals. The most important application thereof is growing a monocrystalline silicon ingot, which is sliced into silicon wafers for fabrication of semiconductor circuits thereon. Briefly described, the CZ process includes melting a charge of polycrystalline silicon in a quartz crucible and lifting a monocrystalline seed from the surface of the melt silicon. As the seed is being lifted from the melted silicon, monocrystalline silicon grows from the seed and forms a cylindrical ingot. The modern CZ process produces silicon ingots having a diameter as large as 300 mm.

The key to produce silicon wafers with a uniform diameter is to produce silicon ingots with a uniform diameter along the length. It is well known by those skilled in the art that an increase in the pull-speed of the seed results in a reduction of the diameter of a growing silicon ingot therefrom and vise versa. It is also well known that an increase in the temperature of the silicon melt in the crucible results in a reduction of the diameter of a growing silicon ingot and vise versa. While diameter control sounds simple, it requires a sophisticated feedback control.

Conventionally, the CZ process is performed with the PID (proportional-integral-derivative) control method to control the diameter of a growing silicon ingot. The PID controller receives an error signal representing a difference between the target or desired diameter of a growing silicon ingot and the diameter of the silicon ingot actually observed. The PID controller then processes the deviation of the diameter as a function of time and transforms it into a pull-speed error. The pull-speed error is used to adjust the pull-speed of the seed.

Pull-speed control alone is usually insufficient to control the diameter of a growing silicon ingot satisfactorily. Thus, the CZ process is performed with additional PID controller specifically designed to control the temperature of the silicon melt in the crucible. The above pull-speed error is integrated over time to derive a temperature error. The derived temperature error, the target temperature from the temperature profile and the temperature actually measured are summed and provided to the second PID controller to adjust the temperature of the silicon melt.

Although the above described CZ process using two PID controllers to adjust both the pull-speed and the melt temperature simultaneously is widely used in producing silicon ingots, further improvements are needed to produce silicon ingots with diameters sufficiently satisfactorily uniform. In these days, the required standard for precisely and accurately controlling the intrinsic properties of silicon ingots during their growth has become much higher and stricter than it used to be. It is well known that variations of the pull speed that are performed to control the ingot diameter have a negative effect on a defect distribution within the ingot. It is further well known that pull speed variations have a negative effect on morphological stability during the growth of heavily doped ingots. It is therefore necessary to minimize the pull speed variations when controlling the diameter of the silicon ingot during the growth thereof.

Concerning the diameter and growth control, there are three categories of error sources that all lead to pull speed variations while growing silicon ingots to have them with a uniform diameter. The first category of error is caused by temperature fluctuations in the melt. It is well known that the temperature fluctuations in the melt are caused by buoyancy effects which bring about turbulences in the melt flow. Such temperature fluctuations cause changes of the crystallization rate, and such crystallization rate changes then cause changes of the ingot diameter. The diameter control system is designed to react to these diameter changes by outputting pull speed adjustments which result in pull-speed variations.

It is generally known that the melt flow turbulences can be reduced by applying a magnetic field which functions to reduce the melt temperature fluctuations and thereby reduce the pull speed adjustments by the diameter control system. The diameter deviations caused by the temperature fluctuations in the melt are more significant in small diameter ingots than in large diameter ingots, since the temperature fluctuations are localized in the melt, and the effects thereof are averaged over the cross section of an ingot if the diameter thereof is large. However, even under the condition that a large diameter ingot is grown within a magnetic field, there is still need for reducing the pull speed variations.

The second error source resides in the diameter feedback control itself and is caused by an inferior control model. Diameter control is customarily performed, using a PID controller. Those skilled in the art of control theory know that PID controllers are perfect for use in controlling systems that are governed by a linear differential equation of up to $2^{nd}$ order. To some degree, PID control can also be used for controlling non-linear or higher order systems, but only in cases where the control performance and stability are not so important. When it is required to deal with systems that follow non-linear or higher order equations under the condition that the high control performance and high stability are needed, a specialized controller needs to be developed. However, because being convenient and also widely used, the conventional PID controllers are still used in the ingot diameter control, despite the fact that the required standard for control stability, or for reducing pull speed variations, is highly strict in these days and cannot be met by the conventional PID controllers.

The third source of error is caused by input errors, such as noise in an input signal of a diameter measurement indicative of the diameter of a growing ingot. Such noise in the input signal directly affects the diameter control system, causing unnecessary pull-speed variations. An error of this kind may not be so obvious in the prior art control systems because the prior art control systems usually suffer errors attributed to inferior control models adopted therein and such errors are large enough to dominate the input errors. However, an impact of the input errors on the control stability becomes obvious when a specialized control system is used in which an error from an adopted control model is small.

SUMMARY OF THE INVENTION

The present invention specifically addresses errors from the second error source and provides a method and an apparatus for producing silicon crystal ingots with a uniform diameter along their lengths.

Diameter control is nowadays implemented by a digital computer running on a software algorithm, which is patterned after the analog PID control that had existed long before the digital computer appeared. As discussed above, PID control is perfect for use in controlling systems which are governed by a linear differential equation up to order 2. The PID controller can also be used in controlling systems which are governed by a non-linear equation or a linear differential equation of more than order 2, however, at the cost of control performance and stability.

Unfortunately, it is not correctly understood exactly how the ingot diameter responds to a change of the pull-speed. A general perception is that a change of the ingot diameter is the direct result from a change of the pull-speed. Hence, in the prior art diameter control, the P-term is the dominant factor of control in which a change of the pull-speed is calculated as being proportional to a diameter error. However, this is rather an oversimplification of the relationship between the diameter and the pull-speed. What actually happens is that the meniscus appearing between the solid ingot and the liquid silicon melt changes its height as a direct response to a pull-speed change for correcting a pull-speed error.

The pull-speed error is a difference between the zero taper pull-speed and an actual pull-speed observed. The zero taper pull-speed here means the pull speed at which the crystal grows cylindrical. The zero taper pull-speed is determined by the melt temperature and changes thereof. At the zero taper pull-speed, the meniscus can maintain the correct height if the melt temperature is constant. When the actual pull-speed deviates from the zero taper pull-speed, so does the meniscus height from the correct height. Such a deviation of the meniscus height results in a change of the wetting angle at the 3-phase boundary, causing the ingot to grow at a taper angle, instead of growing perfectly vertically or cylindrically. Unless the diameter error becomes large enough to modify the thermal conditions, the ingot would continue to grow while preserving the taper angle. If the diameter error could become large enough, it would eventually find a new equilibrium diameter with which the ingot will grow cylindrically. However, if the temperature was absolutely homogeneous in the crucible, e.g. if the temperature wouldn't change with the radius of growing ingot, the ingot diameter would just continue to grow at the taper angle that is determined by the pull-speed error. Thus, although it is true that a change of the pull-speed causes a change of the diameter, it is a misunderstanding to think that the diameter can be controlled directly by changing the pull-speed. A change of the diameter is not at all the direct result from a change of the pull-speed.

Importantly, the ingot diameter changes over time at a rate which is proportional to a taper multiplied by the actual pull-speed. Since the taper is approximately proportional to a pull-speed error, a diameter change per time is therefore approximately proportional to a term proportional to the pull-speed error plus a term proportional to the square of the pull-speed error. Even though this is still rather a simple model, the model is very useful to design a new diameter control system which can significantly reduce pull-speed variations. First of all, the model illustrates the cause of the errors in the prior art control model, i.e., the non-linear term, or the quadratic pull-speed term, contained in the control model. It further illustrates that it is not the diameter but the diameter taper which is approximately proportional to the pull-speed error.

More importantly, it also shows that it is not very accurate to calculate the integral term, using a diameter error, as performed by the prior art PID control. Again, unless the diameter error is allowed to become so large as to affect the thermal conditions, it is not a good measure for use in deriving an automatic pull-speed offset (the integral term). Rather, it is the taper error that derives a pull-speed offset, because the taper error relates to the meniscus height error, which relates to the pull-speed error, which relates to the melt temperature. Accordingly, the taper error should be used to derive the automatic pull-speed offset by integration.

Further, the calculated value from the integral term which is derived from the taper error is an estimate for the pull-speed for achieving the momentary zero-taper growth (cylindrical growth) and thus also a better representation of a temperature error that causes a deviation of the zero-taper pull-speed from its target.

In order to eliminate the control error attributed to the quadratic term in the differential equation governing the diameter-pull-speed dynamic, the inventor of the present application has transformed the quadratic relationship in the time domain between the diameter change per time and the pull-speed, which is expressed by the following equation:

$$\frac{\partial r(t)}{\partial t} \sim v(t) \cdot \Delta v(t)$$

into a simple, linear relationship in the length domain between the diameter change per length (the diameter taper) of the ingot and the pull-speed, which is expressed by the following equation:

$$\frac{\partial r(z)}{\partial z} \sim \Delta v(z).$$

Based on that, a new simple PID-controller becomes possible which operates on a linear system in the length domain, rather than operating on a non-linear system in the time domain. Thereby, it is possible to eliminate the biggest control model error without the need to develop a complicated non-linear control.

More specifically, the present invention provides a method for growing a monocrystalline silicon ingot from silicon melt according to the CZ process. To implement a feedback control based on the linear relationship between the meniscus taper and the pull-speed, the method comprises defining an error between a target taper of a meniscus and a measured taper, and then translating the taper error into a feedback adjustment to the pull-speed of the silicon ingot. Since control is implemented based on the simple linear relationship, the present invention can achieve the accurate feedback control of the diameter of the silicon ingot. Being able to use the well-known and robust PID mechanism, the present invention is very convenient and well suited for industrial application.

Another aspect of the present invention also addresses the problem that the standard PID controller increases, without limits, its output in proportional relation to the input error. The controller according to the present invention defines slope limits to make sure that the slope at which the controller steers back to the target diameter never exceeds the predetermined limits, even with a very large diameter error. Thus, the controller according to the present invention can avoid too drastic changes of the growth interface when correcting a large diameter error.

In the present invention, the target taper may be derived from the diameter and the pull-speed by processing these data in a kinematic model filter or a more elaborate tracking filter. Thus, the method according to the present invention may further comprise defining an error between a target diameter of the silicon ingot and a measured diameter, and translating the diameter error into the target taper at which the system intends to steer back to the target diameter. Translating the diameter error into the target taper may be achieved by multiplying the diameter error with a constant.

The feedback control according to the present invention is unique in that the taper-errors are integrated over the pulled ingot length to derive an i-term of the feedback adjustment, instead of having the diameter errors integrated over time as performed in the conventional diameter control. The feedback operation also multiplies the taper error with a constant to derive a p-term of the feedback adjustment.

In addition to the feedback control, the present invention also implements a feed-forward control. The feed-forward control according to the present invention predicts an adjustment to the pull-speed from the target taper. Thus, the method of the present invention further comprises the operation of translating the target taper into a feed-forward adjustment to the pull-speed. The adjustment from the feed-forward control and the adjustment from the feedback control may both be used to adjust the pull-speed. The adjustment from the feed-forward control enables quick response to a diameter deviation.

The integral term of the controller yields a good estimate of the zero diameter error pull-speed or the zero taper pull-speed, even when it is operating under target taper clipping conditions. In other words, the difference between the target pull-speed and the i-term adjustment from the controller is a perfect input for the heater control that contains less components that are unrelated to the melt temperature. This is particularly helpful while correcting a large diameter error.

The present invention implements temperature control of the silicon melt. For this purpose, the method according to the present invention further comprises the operation of translating the i-term adjustment to the pull-speed into a deviation of the temperature of the silicon melt. The i-term adjustment is a good representation of a temperature deviation and is integrated over time to derive the temperature deviation. Using the temperature deviation, the method according to the present invention effects a PID control to control the temperature of the silicon melt.

The present invention is contemplated to be implemented in a modified controller in which a PI-control operates in the length domain with a dynamic taper set-point, or a target taper, derived from a diameter deviation. Such a modified controller has advantages of improved control stability and high adaptation for tuning. Please note, however, that the present invention is also implementable in a regular PID controller operating in the length domain. Such a regular PID controller operating in the length domain has already been found achieving a significant improvement over prior art.

Therefore, the present invention also provides a method for growing a monocrystalline silicon ingot from silicon melt according to the CZ process in which an error is defined between a target value of a parameter and a measured value of the parameter and then integrated in a length domain to derive a feedback adjustment to a pull-speed of the silicon ingot in order to make a diameter of the silicon ingot uniform along its length.

DETAILED DESCRIPTION OF THE DRAWINGS AND THE PRESENTLY PREFERRED EMBODIMENTS

Hereinafter, a detailed explanation of the method and apparatus for controlling the diameter of a monocrystalline silicon ingot according to the present invention will be given with reference to the attached drawings.

Figure 1:
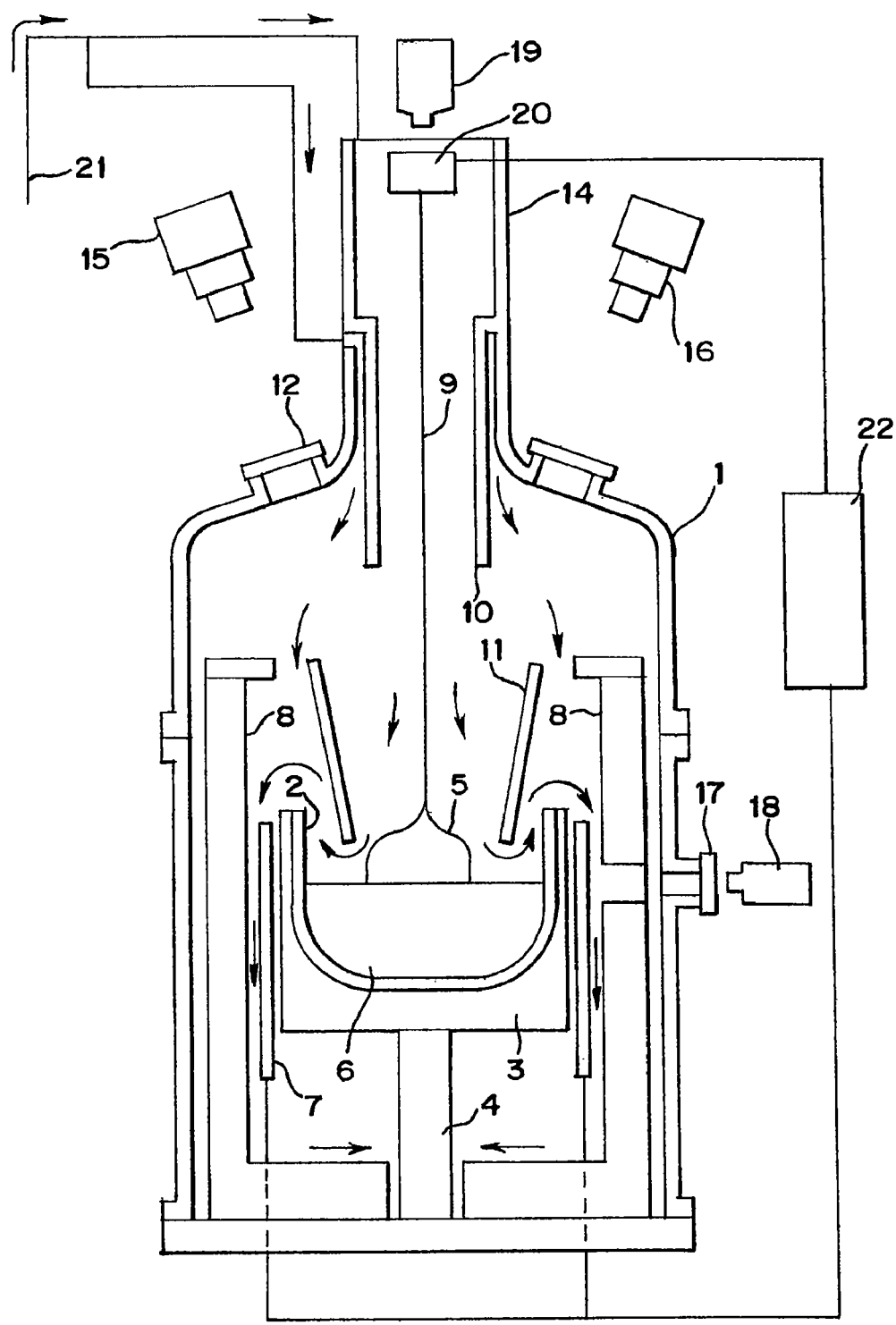
FIG. 1 is a schematic view showing a silicon crystal growing apparatus according to the present invention.

Referring now to FIG. 1, an apparatus according to the present invention is shown for use in implementing a CZ crystal growing process. In this figure, the apparatus comprises a furnace 1. Inside the furnace 1, a quartz crucible 2 is provided which holds silicon melt 6. The quartz crucible 2 is received by a graphite susceptor 3, which is fixed at the top of a drive shaft 4. The drive shaft 4 moves vertically and rotates to thereby move the quartz crucible 2 vertically and also rotate it. A carbon heater 7 surrounds the susceptor 3 and heats the crucible 2 to control the temperature of the silicon melt 6 in the crucible 2. An insulation tube 8 is placed between the heater 7 and the furnace wall.

A tubular radiation heat shield 11 is suspended above the silicon melt 6. The heat shield 6 prevents changes of the heat history of a silicon ingot being lifted and also prevents impurities, such as CO gas from the heater 7, from entering the silicon ingot being lifted. A water cooled cooling pipe 10 is attached to the inside of a neck 14 of the furnace 1. The cooling pipe 10 controls the heat history of the silicon ingot during the lifting process. Between the cooling pipe 10 and the inner wall of the neck 14, an annular gas passage is formed through which a feed pipe 20 supplies Argon gas inside the furnace 1.

A wire 9 runs vertically through the neck 14 and the cooling pipe 10 down to the silicon melt 6 in the crucible 2. The wire 9 holds a monocrystalline silicon seed at its end. A servo motor 20 pulls up the wire 9 and lifts the crystal seed from the surface of the silicon melt 6. FIG. 1 shows a silicon ingot 5 growing out of the silicon melt 6 as the servo motor 20 pulls the wire 9 up. The wire 9 and thus the seed can be rotated by another motor not shown in the figure.

Windows 12 and 13 are formed in a shoulder of the furnace 1. An ADR sensor 15 measures through the window 12 the diameter of the silicon ingot 5 being pulled up. A line camera 16 is used to observe through the window 13 the crystal growing process occurring inside the furnace 1. A window 17 is formed in the side wall of the furnace 1, through which an ATC sensor 18 monitors the temperature of the heather 7. Further, a dichromatic thermometer 19 is placed at the top of the furnace 1 and measures the temperature of the silicon melt 6.

All the data collected by sensors 15, 16, 18 and 19 are supplied to a controller 22. The controller 22 processes the supplied data and controls the servo motor 20 and the heather 7 so as to produce a silicon ingot with a uniform diameter along the length. The controller 22 also controls a vertical movement and a rotation of the drive shaft 4. Particularly, the controller 22 controls a vertical movement of the drive shaft 4 to keep constant the vertical position of the interface between the growing silicon ingot 5 and the silicon melt 6.

Referring to FIG. 1, how the CZ process is implemented inside the furnace 1 will be explained. A charge of polycrystalline silicon is first placed in the crucible 2. Argon gas is flown into the furnace 1 through the feed pipe 20 to fill the furnace 1 with the argon gas. The heather 7 is turned on to heat the crucible 2 and melt the polycrystalline silicon inside the crucible. The heather 7 is controlled to maintain the temperature of the silicon melt 6 according to a predetermined temperature profile.

Next, the servo motor 20 is driven to lower the wire 9 until the monocrystalline silicon seed attached to the end of the wire 9 is partially submerged in the silicon melt 6. Thereafter, the quartz crucible 2 and the crystal seed start begin rotated in the opposite directions. The servo motor 20 then begins pulling up the wire 9 according to a predetermined pull-speed profile. As the crystal seed is being pulled up, the ingot 5 grows from the seed.

At regular intervals, e.g., every one second, the controller 22 collects the diameter information from the sensor 15 and the temperature information from the sensor 19. Based on the collected information, the controller controls the servo motor 19 and the heather 7. By controlling the pull-speed and the temperature of the silicon melt 6, the diameter of the ingot 5 gradually increases from the crystal seed to thereby form a conical neck portion. When the ingot has grown to the intended diameter, the controller shifts its control so that the growing ingot 5 will have the constant diameter. When the ingot 5 has grown to the intended length, the controller 22 again shifts its control to gradually reduce the diameter of the ingot 5 to form a conical tail portion.

During the ingot growing process, as the ingot 5 grows, the surface of the silicon melt goes lower. To compensate the decent of the melt surface and keep constant the vertical level of the interface between the ingot 5 and the silicon melt 6, the controller has the crucible 2 raised by the drive shaft 4. When the diameter of the tail portion becomes nearly zero, the ingot 5 is lifted away from the silicon melt. The heater 7 is turned off to terminate the CZ process.

Figure 2:
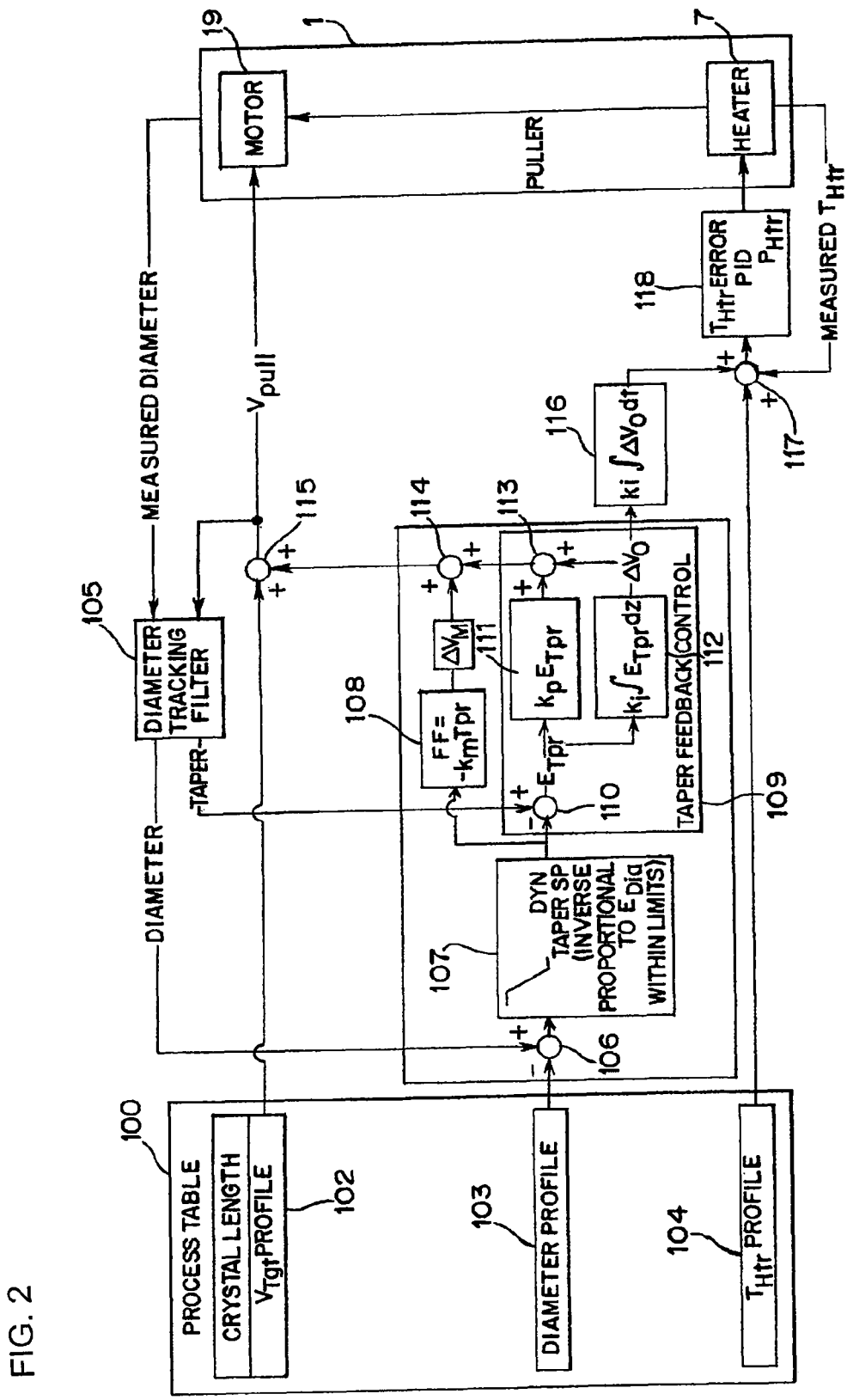
FIG. 2 is a diagram showing a control model according to the present invention which is used in the apparatus shown in FIG. 1

FIG. 2 illustrates the control model of the present invention for producing an ingot with a uniform diameter along the length. In FIG. 2, a process table 100 is shown which is stored in the controller 22. The process table includes information of the intended ingot length 101. The process table 100 also includes a pull-speed profile table 102 which includes information on the target pull-speeds to be achieved during the CZ process. A diameter profile table 103 includes information on the target diameters to be achieved during the CZ process. A temperature profile table 104 includes information on the target temperatures to be achieved during the process.

Shown on the other side of FIG. 2 is the furnace 1. The servo motor 19 for pulling up the wire 9 and the heater 7 for heating the crucible 2 are shown inside the furnace 1. Control signals are supplied to the servo motor 19 and the heater 7 to achieve the desired pull-peed and temperature of the silicon melt in order to produce a silicon crystal ingot with a uniform diameter along the length.

Figure 3:
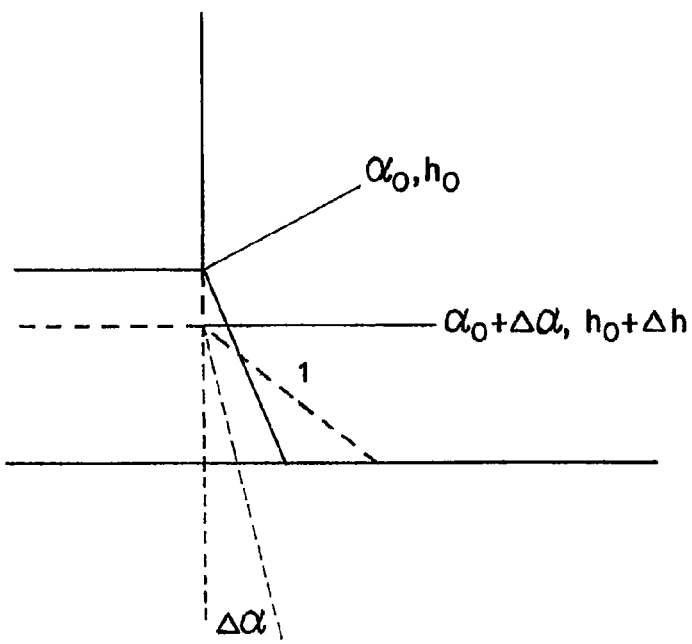
FIG. 3 is a schematic view showing a meniscus formed at the interface between a growing silicon ingot and silicon melt.

The control model used in the present invention operates not in the time domain but uniquely in the length domain. FIG. 3 shows the interface between the growing ingot 5 and the silicon melt 6. Between the solid ingot 5 and the liquid melt 6, a tapered portion, called a meniscus, is formed. Those skilled in the art recognize that the shape of the meniscus is an important determinant to the diameter of the growing crystal ingot. In the figure, "α" represents an angle of the meniscus taper and "h" represents a height of the meniscus.

Given the shape of the meniscus, the diameter of a growing ingot can be expressed by following Equation (1):

$$\frac{\partial r}{\partial t} \approx v \cdot \Delta \alpha \tag{1}$$

The equation tells that the larger the pull-speed becomes, the larger a diameter change per time becomes. Also, a diameter change per time is proportional to a deviation of the meniscus wetting angle from the angle at which the ingot grows perfectly vertically or cylindrically. Those skilled in the art also recognize that the meniscus angle deviation has an approximate linear relationship with a change of the pull-speed.

$$\Delta \alpha \approx const \cdot \Delta v \tag{2}$$

The relationship between the diameter and the pull-speed is derived from Equations (1) and (2) as follows:

$$\frac{\partial r}{\partial t} = const \cdot v \cdot \Delta v \tag{3}$$

Equation (3) describes the system that is to be controlled by the diameter controller.

Equation (3) shows that the diameter and the pull-speed have a quadratic relationship in the time domain. PID control cannot achieve optimal control on such non-linear system, because PID control by design can only optimally compensate errors of systems governed by a linear differential equation of up to second order.

In the CZ process, a pull-speed determines the growing speed of an ingot at the meniscus. Thus, a pull-speed is a change of vertical location (z) of an ingot at the meniscus.

$$v = \frac{\partial z}{\partial t} \tag{4}$$

Equations (3) and (4) yield the follow equation:

$$\frac{\partial r}{\partial z} = const \cdot \Delta v \tag{5}$$

Equation (5) shows that a diameter change per pulled length has an approximately linear relationship with a change of the pull-speed. A change of diameter per pulled length means a taper of the ingot. Thus, Equation (5) tells that the ingot taper has an approximately linear relationship with a change of the pull-speed. Equation (5) is intuitive that the diameter and the pull-speed have a linear relationship in the length domain. Therefore, by applying the PID control in the length domain, rather than the time domain, it becomes possible to achieve optimal control for the ingot growing process, without sacrificing control performance and stability.

However, since the control computer still samples inputs and adjusts outputs on a time scale, implementing the PID control operating in the length domain requires some additional measures as compared to the conventional PID control. Returning to FIG. 2, an embodiment of the present invention comprises a diameter tracking filter 105. In the simplest form, this filter may be a kinematic model filter. Those skilled in the art of control theory and data tracking recognize that other more elaborate tracking filters, such as a Kalman-Filter, may be used as well in order to produce instantaneous diameter and taper data. The filter receives a signal indicative of a measured diameter from the sensor 15 and a signal indicative of the pull-speed and outputs a signal indicative of the actual diameter. The filter 105 also calculates a diameter change per length (the taper) of the growing ingot from the measured diameter and the pull-speed and outputs a signal indicative of the calculated taper which represents an actual taper of the growing crystal.

The actual diameter from the filter 105 is evaluated at an adder 106 against the target diameter from the diameter profile table 103. A diameter error, i.e., a difference between the actual diameter and the target diameter, is translated into a target taper at a taper profiler 107. The taper profiler 107 uses following equations to calculate a target taper $TP_{target}$.

if $|TP_{target}| < TP_{limit}$ $TP_{target} = const \cdot Error_{diameter}$ otherwise $TP_{target} = +/- TP_{limit}$ where $TP_{target}$ is the target taper to be achieved, $TP_{limit}$ is the maximum absolute taper (the absolute $TP_{target}$ cannot exceed $TP_{limit}$), and $Error_{diameter}$ is the difference between the actual diameter and the target diameter. The target taper $TP_{target}$ is then supplied to a feed-forward control 108 and a feedback control 109.

Figure 4:
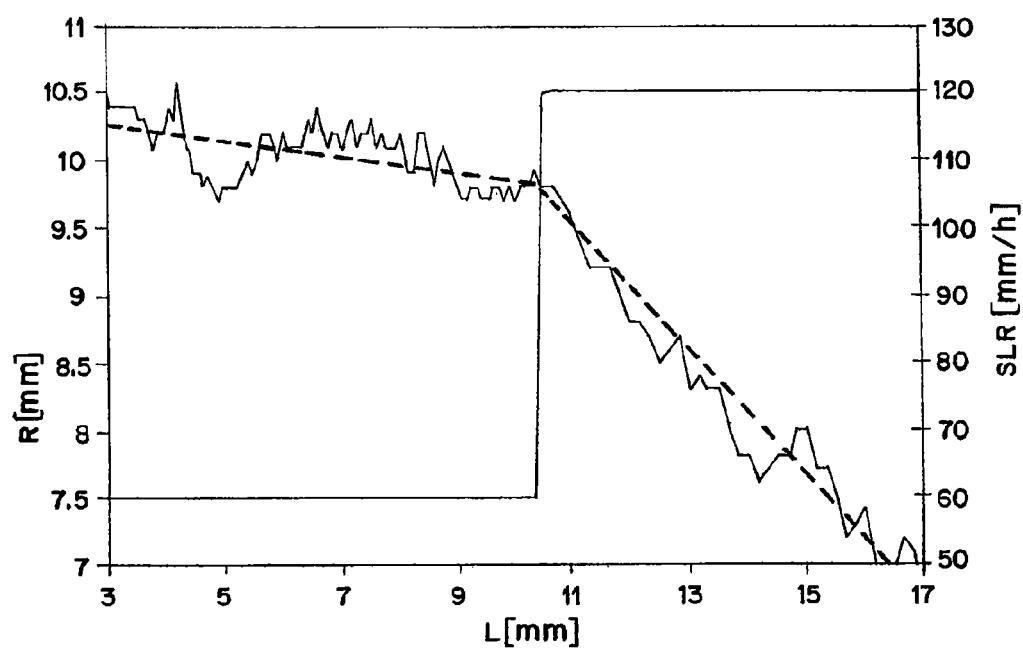
FIG. 4 is a graph showing experimental data illustrating the relationship between a change of the diameter of a growing silicon ingot and a change of the pull-speed.

The feed-forward control 108 sets, from the target taper $TP_{target}$, a FF adjustment $\Delta V_M$ to be made to the pull-speed. The control model according to the present invention implements a feed-forward control in addition to a taper feedback control by setting an exact pull-speed offset known to be needed to achieve the target taper. The FF adjustment $\Delta V_M$ is calculated from the empirical data. FIG. 4 shows experimental data which indicates how the diameter responded when the pull-speed changed. In FIG. 4, an ingot was first pulled at the speed of 60 mm/h. When the ingot had grown to 10.5 mm in length, the pull-speed changed from 60 mm/h to 120 mm/h. The diameter was being measured and plotted in relation to the pulled ingot length to monitor its changes during the crystal growing process. The solid line shows the actual measurements and the dash line linearly traces the actual measurements. The meniscus tapers are calculated from the diameter slopes in the graph in FIG. 4. Since FIG. 4 shows the relationship between a meniscus taper and a pull-speed change, it can be determined from FIG. 4 how much the pull-speed should be adjusted to achieve a certain taper change. Since the relation between the taper and the pull-speed change can be easily determined experimentally, this control model can effect the precise, basic response to diameter deviations and improves its adaptation to tuning.

The target taper $TP_{target}$ from the taper profiler 107 is evaluated at an adder 110 in the feedback control 109 against the actual taper calculated by the diameter tracking filter 105 to determine a taper error $E_{Tpr}$, or a deviation of the calculated taper from the target taper $TP_{target}$. In the feedback control 109, the taper error $E_{Tpr}$ is both proportionally and integrally adjusted by a proportional operator 111 and an integral operator 112 and translated into a FB adjustment (i-term adjustment and p-term adjustment) to the pull-speed at an adder 113. Please note that in the present invention, the taper error $E_{Tpr}$ is integrated by the integral operator 112 over the pulled ingot length (z), not over time (t), and translated into an adjustment $\Delta V_0$ to the pull-speed (i-term adjustment). The FB adjustment is then added at an adder 114 with the FF adjustment $\Delta V_M$ from the feed-forward control 108. The target pull-speed from the pull-speed profile table 102 is adjusted at an adder 115 with a sum of the pull-speed adjustments from the feed-forward control 108 and the feedback control 109 and supplied to control the servo motor 19. The adjusted pull-speed is also supplied to the diameter tracking filter 105.

As discussed above, the taper error $E_{Tpr}$ is integrated over the pulled ingot length and translated into the i-term adjustment $\Delta V_0$. The i-term adjustment $\Delta V_0$ is a sum of taper errors over the pulled ingot length. The difference between $\Delta V_0$ and the target pull-speed is a good representation of a temperature deviation in the silicon melt 6, even when correcting large diameter errors, provided that the taper limitation is active. The i-term adjustment $\Delta V_0$ is then integrated by an integral operator 116 over time and translated into a temperature adjustment. The temperature adjustment from the i-term adjustment $\Delta V_0$ is added at an adder 117 with the target temperature from the temperature profile table 104 and the measured temperature from the sensor 19 to derive a temperature error. The temperature error goes through the PID controller 118 to control the heather 7.

Figure 5:
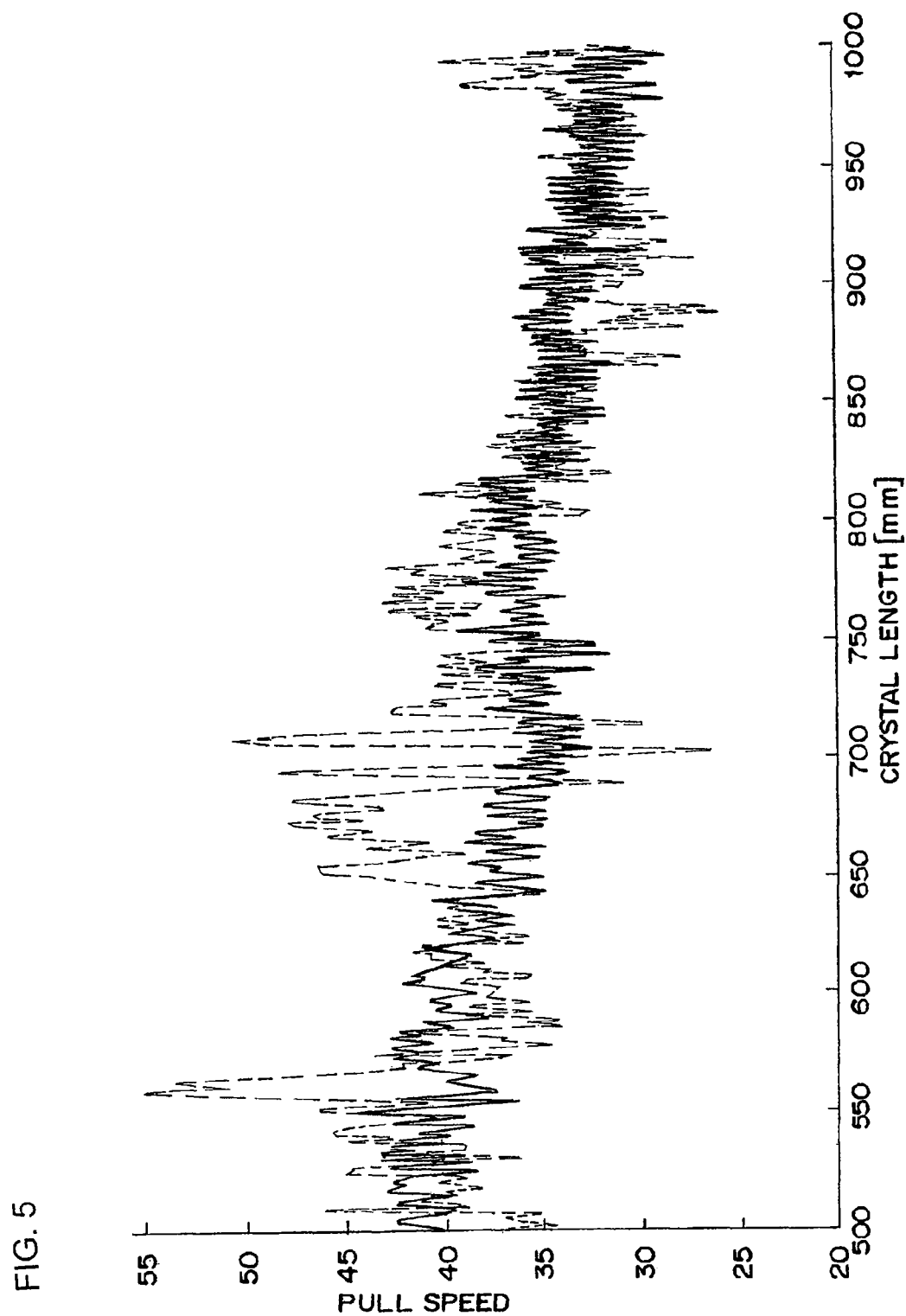
FIG. 5 is a graph comparing traces of pull-speed control performed by the present invention and the conventional PID control.

FIG. 5 shows a comparison of changes of the pull-speed which resulted from (1) an implementation of the conventional PID controller and an implementation of the present invention. The pull-speed changes under the control of the conventional PID controller are shown with broken lines. The pull-speed changes under the control of the present invention are shown with solid lines. As shown in FIG. 5, the pull-speed more significantly changes under the control of the conventional PID controller than under the control of the present invention. It is clear that the conventional control repeats overshooting the targets back and forth. These "bumpy" controls also manifest themselves as relatively large diameter deviations along the length of an ingot. Compared to the conventional PID control, the control according to the present invention effects relatively small diameter deviations along the length while at the same time the amount of pull-speed variation that is applied in order to control the diameter is significantly reduced.

Figure 6:
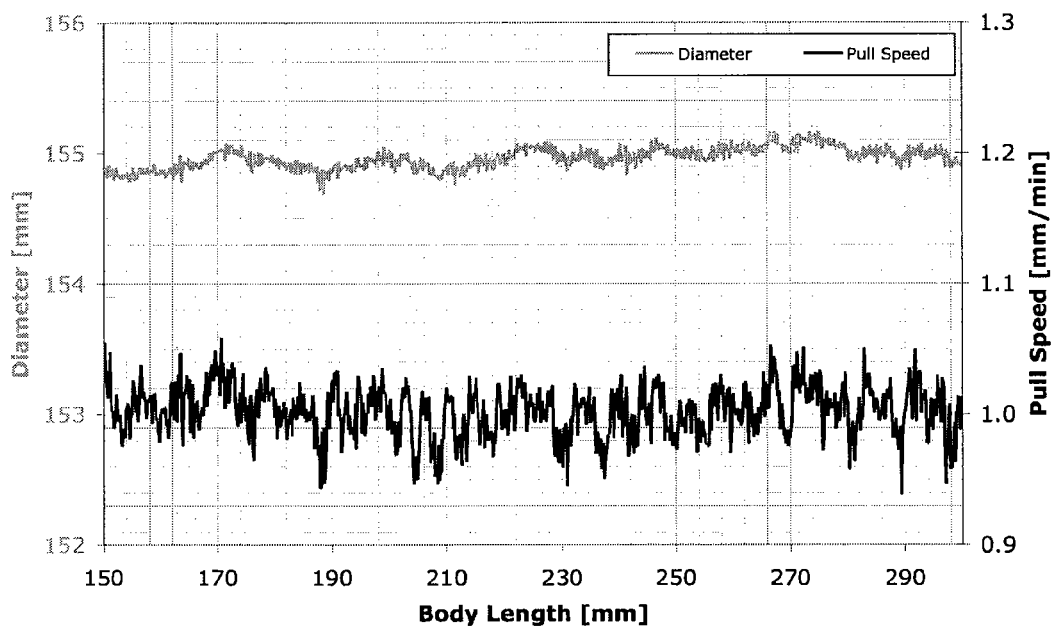
FIG. 6 is a graph showing control of the diameter and the pull speed under the present invention.
Figure 7:
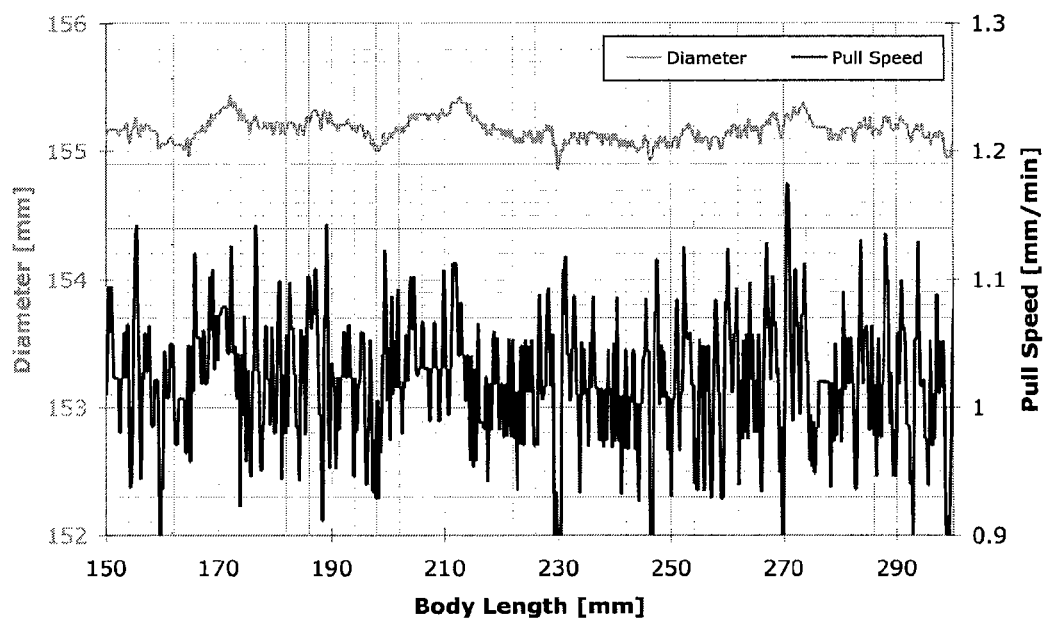
FIG. 7 is a graph showing control of the diameter and the pull speed under the conventional PID control.

FIGS. 6 and 7 also show comparisons between the present invention and the conventional PID control. FIGS. 6 and 7 show that changes of the diameter and the pull-speed are significantly reduced in the present invention compared to those controlled by the conventional PID control.

In the above embodiment, a modified controller is used in which a PI-control operates in the length domain as a taper feed-back control with a dynamic taper set-point, or a target taper, derived from a diameter deviation. Such a modified controller has advantages of improved control stability and high adaptation for tuning. However, those skilled in the art of control theory can appreciate that the present invention is also implementable in a regular PID controller operating in the length domain. Such a regular PID controller operating in the length domain has already been found achieving a significant improvement over prior art.

As various changes could be made in the above constructions and methods without departing from the scope of the invention, it is intended that all matter contained in the above description or shown in the accompanying drawings shall be interpreted as illustrative and not in a limiting sense.

The invention claimed is:

1. A method for growing a monocrystalline silicon ingot from silicon melt according to the CZ process, comprising:
    defining an error between a target taper of a meniscus and a measured taper; and
    translating the taper error into a feedback adjustment to a pull-speed of the silicon ingot, wherein translating the taper error into a feedback adjustment comprises integrating the taper error over a length of the grown ingot length to derive an i-term of the feedback adjustment.

2. A method according to claim 1, further comprising:
defining an error between a target diameter of the silicon ingot and a measured diameter; and
translating the diameter error into the target taper.

3. A method according to claim 2, wherein translating the diameter error into the target taper comprises multiplying the diameter error with a constant within predetermined taper limits.

4. A method according to claim 1, wherein the measured taper is calculated from the pull-speed and the measured diameter.

5. A method according to claim 1, wherein translating the taper error into a feedback adjustment comprises multiplying the taper error with a constant to derive a p-term of the feedback adjustment.

6. A method according to claim 1, further comprising translating the target taper into a feed-forward adjustment to the pull-speed.

7. A method according to claim 1, further comprising translating the i-term adjustment to the pull-speed into a deviation of the temperature of the silicon melt.

8. A method according to claim 7, wherein translating the i-term adjustment to the pull-speed comprises integrating the i-term adjustment over time to derive the temperature deviation.

9. A method according to claim 7, further comprising effecting a PID control, using the temperature deviation, to control the temperature of the silicon melt.

10. A method according to claim 1, wherein translating the taper error into a feedback adjustment comprises using the following equation:

$$\frac{\partial r}{\partial z} = const \cdot \Delta v$$

where, r denotes a diameter of the ingot, z denotes a length of the grown ingot and $\Delta v$ denotes a pull-speed error.

11. A method for growing a monocrystalline silicon ingot from silicon melt according to the CZ process, comprising:
defining an error between a target value of a parameter and a measured value of the parameter; and
integrating the error in a length domain to derive a feedback adjustment to a pull-speed of the silicon ingot in order to make a diameter of the silicon ingot uniform along its length.

12. A method according to claim 11, wherein the parameter is a taper of an ingot.

13. A method according to claim 11, wherein the parameter is a diameter of the silicon ingot.

14. A method according to claim 11, wherein integrating the error in a length domain comprises integrating the error over a length of the grown silicon ingot.

* * * * *